United States Patent [19]

Buettner

[11] 4,051,919

[45] Oct. 4, 1977

[54] HIGH FIDELITY SPEAKER ENCLOSURE

[75] Inventor: John M. Buettner, Willoughby Hills, Ohio

[73] Assignee: John M. Buettner, Willoughby Hills, Ohio

[21] Appl. No.: 638,555

[22] Filed: Dec. 8, 1975

[51] Int. Cl.[2] .............................................. H05K 5/00

[52] U.S. Cl. ................................... 181/144; 179/1 E

[58] Field of Search ............................... 181/144–147, 181/148–156; 179/1 E

[56] References Cited

U.S. PATENT DOCUMENTS

| | | | |
|---|---|---|---|
| 2,710,662 | 6/1955 | Camras | 181/145 |
| 3,026,957 | 3/1962 | Gladstone | 181/147 X |
| 3,670,842 | 6/1972 | Ekdahl et al. | 179/1 E X |
| 3,933,219 | 1/1976 | Butler | 181/144 |

*Primary Examiner*—Lawrence R. Franklin
*Attorney, Agent, or Firm*—Tim Tinkler

[57] ABSTRACT

A high fidelity speaker array comprises a full range speaker board, a pair of tweeter boards disposed at an angle of from 120° to 165° with respect to said full range speaker board, and a pair of midrange speaker boards disposed at an angle between 5° and 85° with respect to said full range speaker board, each tweeter board being between and abutting said full range speaker board and a midrange speaker board.

3 Claims, 2 Drawing Figures

HIGH FIDELITY SPEAKER ENCLOSURE

BACKGROUND OF THE INVENTION

Two general types of high fidelity speaker arrangements are commonly employed. In the more conventional arrangement, all speakers are directed to the front of the speaker cabinet, no use being made of reflected sound. Thus, the single full range speaker (or array of woofers, tweeters, and midrange speakers) is mounted on a board which comprises the face of the speaker cabinet. While such a system is capable of accurate sound reproduction, it is necessary for the listener to be positioned directly in front of the cabinet in order to realize the full benefit, since high frequency sounds in particular are lost to either side. This is for the reason that high frequency sound waves are both more narrowly directed and nonreflecting. Thus, those listeners substantially out of direct line will not hear the high notes, thereby losing the benefit of the initially accurate sound reproduction.

More sophisticated systems attempt to make use of reflected sound. This usually entails mounting a number of full range speakers in the cabinet facing in various directions. In this fashion, portions of the reproduced sound reflect from nearby walls, giving the impression that sound is coming from a much larger area. However, single full range speakers capable of true sound reproduction are not readily available and much of the high frequency sound is again lost owing to its nonreflecting characteristics. That is, the direction of the full range of sound onto a reflecting surface benefits the low and midrange sounds but not those at the high end of the audible range. Further, absent the presence of reflecting surfaces, little benefit is realized.

STATEMENT OF THE INVENTION

Therefore, it is an object of the present invention to provide a high fidelity speaker array capable of providing accurate sound reproduction to listeners at diverse locations within a room.

It is a further object of the present invention to provide a high fidelity speaker array which makes use of reflecting surfaces to increase the presence of sound obtained from a high fidelity speaker cabinet.

These and other objects of the present invention will become apparent to those skilled in the art from the specification and claims which follow.

There has now been found a vertically disposed high fidelity speaker array mounted in an enclosure, which array comprises:

a. a full range speaker board, b. a pair of tweeter boards disposed at an angle between 120° and 165° with respect to said full range speaker board, and c. a pair of midrange speaker boards disposed at an angle between 5° and 85° with respect to said full range speaker board, d. said tweeter boards being disposed between and abutting said full range and midrange boards, e. all speakers being directed away from the area defined by said boards.

Such an array provides a number of advantages. The use of offset tweeters channels additional high frequency sound waves out of the direct line from the front of the cabinet but not at such an acute angle that the sounds are lost on reflecting surfaces. Midrange sounds, however, are directed at such an angle as to reflect from nearby walls, thereby increasing the presence of sound (i.e., the impression that the sound is coming from a larger area). The overall result is that accurate reproduction and enhancement of sound are enjoyed at diverse areas within a room.

DESCRIPTION OF THE PREFERRED EMBODIMENTS

It will be understood that the invention relates only to the arrangement of speakers within a high fidelity speaker cabinet. Therefore, it is independent of such matters as speaker design, materials of construction, dimensions, and the like, which matters are all within the knowledge of those skilled in the art.

Essentially, the invention comprises an array of speaker boards including a full range speaker board, two tweeter boards, and two midrange speaker boards.

The term "full range speaker board" is intended to encompass a suitable mounting board bearing a speaker or speakers capable of reproducing substantially the full range of audible sound, i.e., from about 30 to 20,000 cycles per second. This may be accomplished by the use of a single full range speaker or, more desirably because of the more accurate reproduction possible over the entire range, a combination of a separate woofer (30–600 cps), a midrange speaker (500–3,500 cps), and a tweeter (3,000–20,000 cps). Obviously, more than one of any or all individual speakers may be present.

Clearly then a "tweeter board" is one which carries at least one tweeter while a "midrange board" carries at least one midrange speaker. Although it is possible, for example, for the midrange board also to carry a tweeter, such arrangements are generally not necessary.

Those skilled in the art will recognize the desirability of tying the various speakers together with an electronic crossover network (or networks) in order to optimize the performance of each speaker within its appropriate range.

The method by which the various speaker boards are assembled to comprise the array will become apparent by reference to the drawings.

Figure 1:
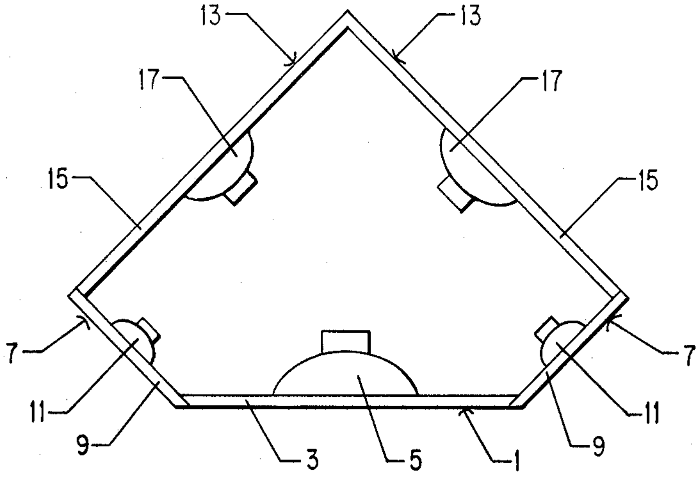
FIG. 1 is a plan view of a speaker array according to the present invention.

In FIG. 1 there is designated generally a full range speaker board 1 comprised of a suitable board 3 carrying, in this instance, a full range speaker 5. Abutting each end of the full range speaker board 1 is a tweeter board 7 comprised of a board 9 and a tweeter 11. The angle between each tweeter board 7 and full range speaker board 1 is within the range of from 120°–165°, in order to direct high frequency sound to those listeners not situated directly in front of the speaker cabinet. If the angle is substantially less than 120°, most of the nonreflecting high frequency sounds from the tweeter board would be lost. If the angle is greater than 165°, there will be no substantial enhancement of the sound to those situated to the side of the cabinet.

In turn, abutting each tweeter board 7 is a midrange board 13 comprised of a board 15 and midrange speaker 17. Here, the angle, again with respect to the full range speaker board 1, is between 5 and 85°, especially 15 to 75°. The main purpose of such a displacement is to provide reflected midrange sounds from adjacent walls in order to enhance listening enjoyment.

Figure 2:
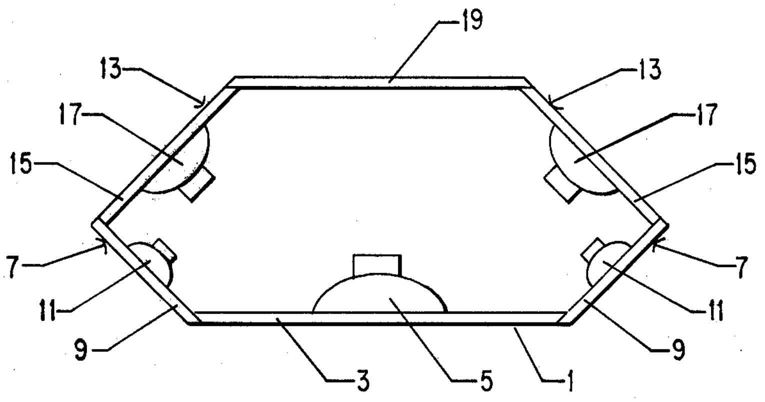
FIG. 2 is a second plan view of a speaker array according to the present invention, including a reflecting board in the assembly.

As will be seen in FIG. 2, it is often necessary or desirable to complete the speaker enclosure by providing a reflecting board 19 at the rear of the speaker cabinet parallel to the full range speaker board 1 and abutting midrange boards 13. The purpose of the reflecting board 19, if used, is to alter the volume of the speaker enclosure as required to optimize woofer performance. As those skilled in the art realize, volume requirements vary from woofer to woofer and cabinet dimensions should be finalized in accordance with the characteristics of the individual woofer, following principles such as are set forth at "Hi-fi Loudspeakers and Enclosures", A. B. Cohen, 2nd Ed., 1968, esp. cpt. 10.

I claim:

1. A vertically disposed high fidelity speaker array mounted in an enclosure, which array comprises:

a. a full range speaker board, b. a pair of tweeter boards disposed at an angle from 120° to 165° with respect to said full range speaker board, and c. a pair of midrange speaker boards disposed at an angle between 5° and 85° with respect to said full range speaker board, d. said tweeter boards being disposed between and abutting said full range and midrange boards, e. each board bearing at least one speaker thereon, and f. all speakers being directed away from the area defined by said boards.

2. An array as in claim 1 wherein said pair of midrange speaker boards abut each other.

3. An array as in claim 1 wherein a reflecting board is disposed parallel to said full range speaker board, said tweeter boards and midrange speaker boards being disposed between said full range speaker board and said reflecting board, each board abutting the next adjacent boards.

* * * * *